United States Patent [19]

Belisomi

[11] 4,223,352
[45] Sep. 16, 1980

[54] CONTROL CIRCUIT

[75] Inventor: Pietro Belisomi, Pinerolo, Italy

[73] Assignee: Indesit Industria Elettrodomestici Italiana S.p.A., Rivalta, Italy

[21] Appl. No.: 874,598

[22] Filed: Feb. 2, 1978

[30] Foreign Application Priority Data

Feb. 2, 1977 [IT] Italy ............... 67219 A/77

[51] Int. Cl.³ .............. H04N 5/24; H04N 5/44; H04B 1/06
[52] U.S. Cl. .................. 358/185; 358/193.1; 455/186
[58] Field of Search ............. 358/185, 193; 325/464; 455/186

[56] References Cited

U.S. PATENT DOCUMENTS 3,953,801  4/1976  Podowski .................. 325/464

FOREIGN PATENT DOCUMENTS 2542021  3/1977  Fed. Rep. of Germany ........... 358/194

OTHER PUBLICATIONS

K. H. Seidler "Digital Tuning System" 2/27/76, Funkschau vol. 48, No. 5, pp. 166–170.

Primary Examiner—Robert L. Griffin
Assistant Examiner—Edward L. Coles
Attorney, Agent, or Firm—Sughrue, Rothwell, Mion, Zinn and Macpeak

[57] ABSTRACT

A circuit device for a television receiver having a tuner device with a tuner memory operable to control the tuning of the receiver to stations selected by a user, in which there are further provided means for automatically adjusting the controls of the receiver whenever the station to which the receiver is tuned is changed, this means comprising one or a plurality of random access memories addressed by signals from the tuner memory which are characteristic of each individual station, the output signal from the RAM, (or the enabled RAM if there are a plurality of them) representing the contents thereof at the location addressed, is fed to a digital-to-analogue converter which produces an output voltage signal for adjusting the associated receiver control; changes to the content of the RAM can be made by means of an associated counter controlled to count up or down by a push button panel.

15 Claims, 2 Drawing Figures

CONTROL CIRCUIT

BACKGROUND OF THE INVENTION

The present invention relates to a circuit device for effecting and memorising adjustments to the setting of the controls of a television signal receiver, especially of a colour television receiver; such controls as the volume, brightness, contrast, colour saturation etc. must often be adjusted when changing stations in order to obtain optimum setting of the controls for each station to which the receiver can be tuned in order to account for differences in the signals from each station. Conventionally, television controls are mechanical control systems using potentiometers inserted into the path of the electric signal to be controlled (direct control) or else supplying a D.C. voltage by means of which electronic voltage control is effected (indirect control).

Such mechanical systems have considerable disadvantages, not only from the point of view of durability, since the potentiometers, being mechanical, are subject to wear, but also from that of performance due to non-linearity and discontinuity in the response. Moreover, such mechanical systems are not easily adaptable to the use of remote controls.

For this reason wholly electronic control systems, which operate indirectly, have been recently introduced. These usually comprise a series of counters which are able to count both up and down, each followed by a suitable digital-to-analogue converter. By energising a counter, selected by operation of one of a number of pairs of push buttons, it is possible to increase or reduce the content of this counter and thereby to cause the corresponding control voltage to vary: such variation is discontinuous, but has sufficient resolution for most purposes.

This latter system eliminates many of the disadvantages of the conventional mechanical controls but it is still not wholly satisfactory because, since each station to which a receiver can be tuned usually has modulation characteristics which are different from those of the others, with every change of station it is necessary to readjust, systematically, the controls of the receiver, that is the volume, brightness, contrast (and colour controls in the case of colour transmission).

In fact at present it is possible in many places to receive a large number of transmitter stations (in some cases more than twenty), and hence television receivers have to allow changeover from one station to another with the greatest simplicity. The technical problem which this invention seeks to solve is the provision of a circuit device which is able to effect adjustment of the controls of a receiver upon changes in the tuning thereof to receive signals from different transmitters, which does not suffer from the disadvantages of known systems.

SUMMARY OF THE INVENTION

According to the present invention there is provided a circuit device for carrying out and memorising adjustments to the tuning of a television receiver for a plurality of transmitter stations, of the type having memory means for memorising the value of control signals determining the tuning of the receiver, in which the said memory means are also operable to produce an output signal characteristic of the station to which the receiver is tuned, and there are means for feeding this signal as an address signal to further memory means in which are stored signals determining the adjustment to at least one of the controls of the receiver, other than the tuning control, means for effecting adjustment of this control automatically in dependence on the said stored signals when the tuning of the receiver is changed to select a different station, and means for selectively changing the signal stored at any one address in the said further memory means whereby to change the adjustment to the said one control of the television receiver.

BRIEF DESCRIPTION OF THE DRAWINGS

Two embodiments of the invention will now be more particularly described, by way of example, with reference to the accompanying drawings, in which.

DETAILED DESCRIPTION OF THE INVENTION

Figure 1:
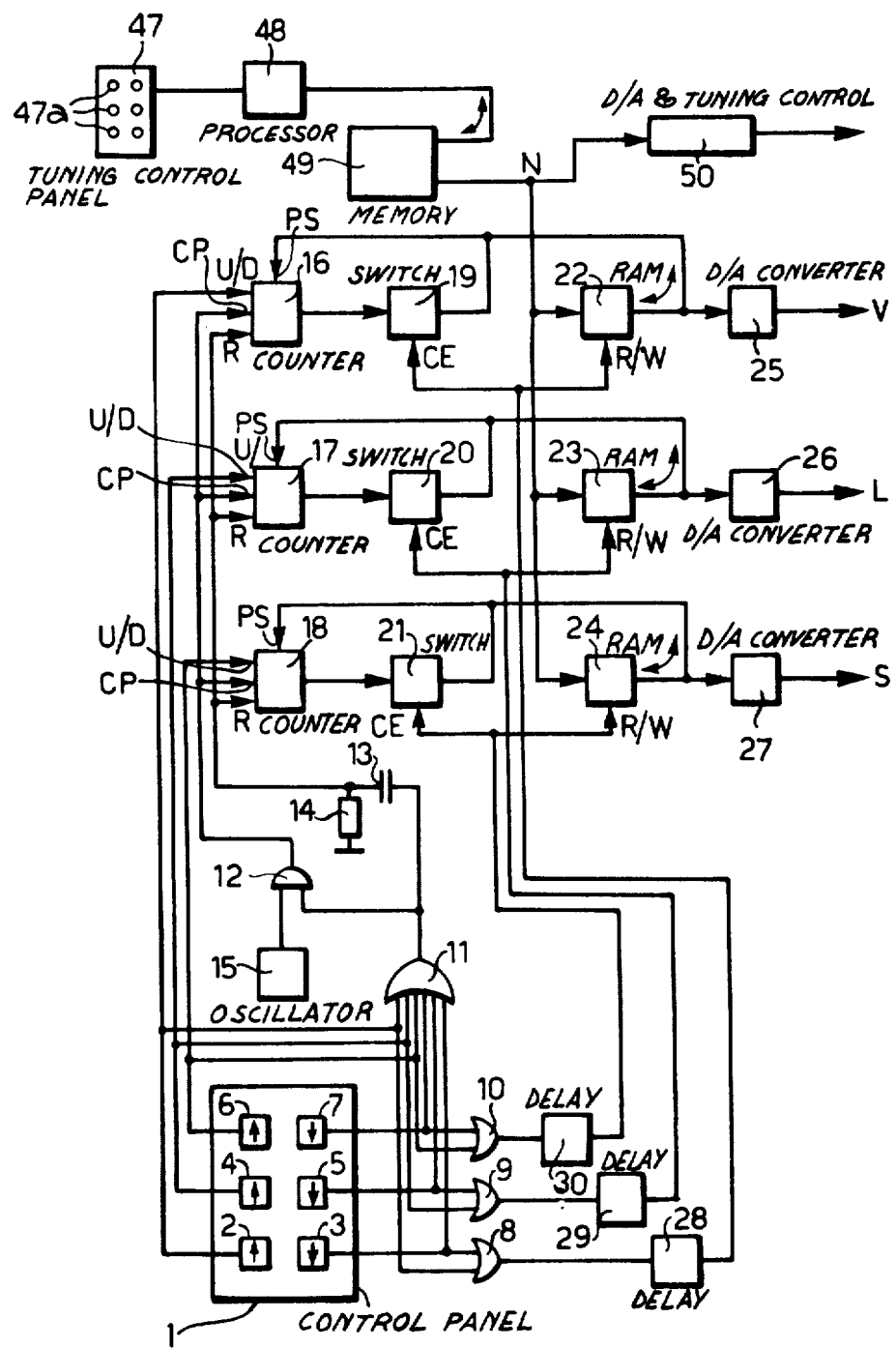
FIG. 1 is a schematic electrical diagram of an adjustment and memorisation circuit for the controls of a television receiver, constructed and arranged as a first embodiment of the present invention.

Referring now to FIG. 1 of the drawings there is shown a control panel 1 which is provided with six adjustment buttons or keys 2, 3, 4, 5, 6, 7. The buttons or keys 2, 4, 6, are connected each to a first input of respective OR gates 8, 9, 10, to respective inputs of a six input OR gate 11, and each to an UP/DOWN input (which controls the counting direction) of a respective one of three counters 16, 17 and 18. The buttons 3, 5, 7 are connected, respectively, to the second inputs of the OR gates 8, 9, 10 and to the remaining three inputs of the OR gate 11.

The output of the OR gate 11 is connected to a first input of an AND gate 12 and, through a differentiator circuit comprising a capacitor 13 which is earthed via a resistance 14, to the reset inputs (R) of the three counters 16, 17, 18; the second input of the AND gate 12 is fed with a signal from a clock generator 15, and the output of the AND gate 12 is connected to the clock inputs (CP) of the three counters 16, 17, 18. The outputs of the three counters 16, 17, 18 are connected, selectively by means of respective switch circuits 19, 20, 21, to the input/output terminals of three random access memories 22, 23, 24 and at the same time to the inputs of three digital-to-analogue converters 25, 26, 27 and, also at the same time to the preset inputs (PS) of the said three counters 16, 17, 18. The outputs of the three OR gates 8, 9, 10, are connected via respective delay circuits 28, 29, 30, to the "enable" inputs (CE) of respective switch circuits 19, 20, 21 and at the same time to the read-write (R/W) inputs of the random access memories 22, 23, 24. Address signals are fed to the three RAMs 22, 23, 24 from a terminal N fed from the output of a tuning control memory 49 having also an input/output line fed from a processor circuit 48 which receives control signals from a tuning control panel 47 having a plurality of push buttons or keys 47a selectively operable to choose the station to which the receiver is to be tuned. The terminal N line of the memory 49 also feeds a tuning control circuit 50 incorporating a digital-to-analogue converter and operating in a known way to control tuning of the receiver in dependence on the station selected. This system operates in a known way and does not form part of the inventive concept of the present invention, and therefore will not be further described.

The outputs of the digital-to-analogue converters 25, 26, 27, indicated by V, L and S, supply the adjustment voltages for the volume, brightness and colour controls.

The circuit described above operates as follows:

When any receivable transmitter station is selected by operation of the station selector panel 47 of the television receiver, there is applied to the input N, by the memory 49 associated therewith, a binary signal representing the selected transmitter station: this binary signal addresses the three random access memories 22, 23, 24 so that at the output thereof there is reproduced the information at present stored in those cells of the memories associated with that transmitter station, which represents the levels of the adjustment signals which were selected on a previous occasion when the receiver was tuned to that transmitter station.

The pairs of buttons 2, 3; 4, 5; and 6, 7 may be used to adjust any three of the controls of the receiver: in this example the controls to be adjusted thereby are the volume, brightness and colour saturation respectively, although they may be connected to control contrast or fine tuning of the receiver instead. The buttons 2, 4 and 6 select adjustment of the associated control in one direction, for example increasing volume, increasing brightness and increasing colour saturation, and the buttons 3, 5 and 7 select adjustment in the opposite direction, decreasing the volume, brightness or colour saturation respectively.

Upon depression, for example, of the key 2 a rest impulse is applied, through the gate 11 and the differentiator circuit comprising the capacitor 13 and resistor 14, to each of the three counters 16, 17, 18 which are then predisposed to count, starting from respective numbers which are preset, at the PS inputs thereof, from the outputs of the respective memories 22, 23, 24. The output signal from the gate 11 also enables the gate 12 to pass the clock pulses, generated by the generator 15, to the clock inputs of the three counters.

Depression of the key 2 also feeds a signal to the OR gate 8 which thus provides an output signal which, after a time delay T introduced by the delay circuit 28, sets the memory 22 to the write mode and opens the switch circuit 19 to pass on signals received from the counter 16 to the memory 22, which records them. The counters 16, 17 and 18 are predisposed to count DOWN and depression of the key 2 passes a signal to the U/D input of the counter 16 to set this in the count UP mode. When the counter 16 receives the preset signal from the RAM 22 it then starts to count up, and this is recorded simultaneously, in that cell of the memory 22 at the address, corresponding to the selected station, determined by the address signal on the input N, and the D/A converter 25 therefore supplies an increasing voltage which causes the volume to increase until the key 2 is released. During this operation, since none of the keys 4, 5, 6 or 7 have been depressed, the gates 9 and 10 have given no signal, and the content of the memories 23 and 24 has not changed.

Upon depressing the key 3, operation of the circuit is identical to that described above, except that no signal is fed to the U/D input of the counter 16 and hence the counter stays set to count down; there is thus produced a reduction in the content of the RAM 22 at the selected address with a corresponding reduction of the output voltage V, and hence a reduction in the volume of the receiver until the key 3 is released.

The pairs of keys 4, 5 and 6, 7 operate in exactly the same way to control, respectively, the counters 17 and 18 and thus the content of the memories 23 and 24. In the absence of any adjusting control effected by depression of the keys of the control panel 1 the digital-to-analogue converters 25, 26, 27 are fed with signals representing the content of the random access memories at the addresses determined by the signal at the input N and the receiver controls remain set at values determined by these.

Figure 2:
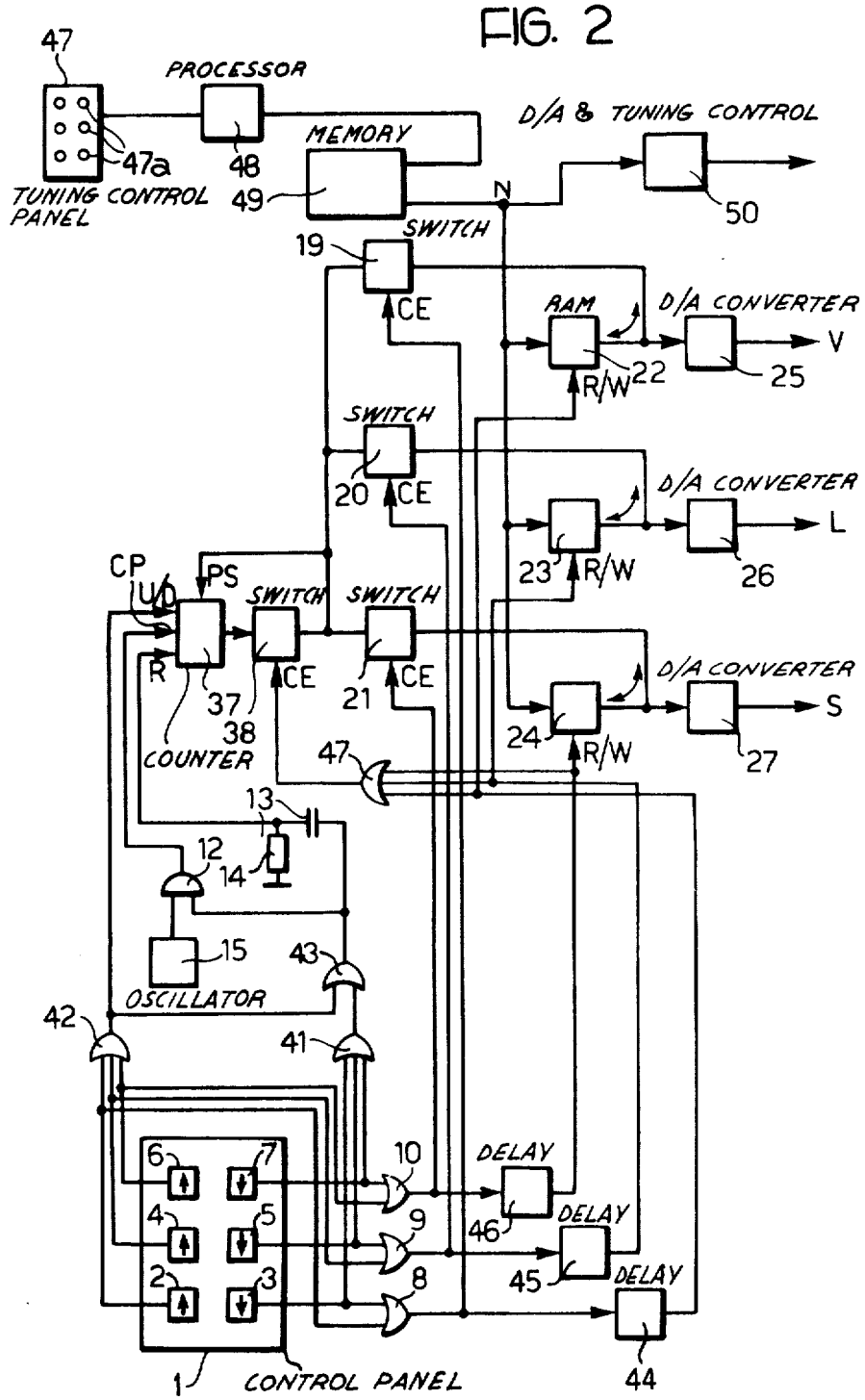
FIG. 2 is a schematic electrical diagram of a second embodiment of the present invention, which is somewhat simpler than the circuit shown in FIG. 1.

In the embodiment of FIG. 2, components fulfilling the same function as corresponding components in the embodiment of FIG. 1 are indicated with the same reference numerals.

The UP keys 2, 4 and 6 of the control panel 1 are connected to respective inputs of an OR gate 42, the output of which is connected to a first input of another OR gate 43 and to the counting direction control input (U/D) of a counter 37; the DOWN keys 3, 5 and 7 are connected to respective inputs of an OR gate 41, the output of which is fed to a second input of the OR gate 43 the output of which is connected to an input of the gate 12 and to the capacitor 13 of the differentiator circuit including the earthed resistor 14.

The output of the OR gates 8, 9, 10 are connected to the enabling inputs (C.E.) of respective switching circuits 19, 20, 21, and via respective delay circuits 44, 45, 46, to the read-write inputs (R/W) of respective random access memories 22, 23, 24 and to respective inputs of an OR gate 47 the output of which is fed to the enable input (CE) of a switching circuit 38.

The clock input of the counter 37 is connected to the output of the gate 12, the reset input is connected to the capacitor 13, the preset input is connected to the three switching circuits 19, 21, 21, and the output is connected to the input of the switching circuit 38 the output of which is fed back to the preset input of the counter 37 and is connected to the three switching circuits 19, 20, 21.

The circuit described with reference to FIG. 2 operates as follows:

By depressing one of the keys 2, 4 or 6 the counter 37 is preset, via the gate 42, to count upwards, and via the gate 43 the passage of clock signals through the gate 12 is enabled. At the same time the associated one of the gates 8, 9 or 10 produces an output signal which enables the associated one of the switching circuits 19, 20 or 21 to pass signals fed to it. The output signal from the said one of the gates 8, 9 or 10, after a delay T introduced by the associated delay circuit 44, 45 or 46 is fed to the read/write input of the associated one of the random access memories which is thereby set to write; at the same, delayed, time the switching circuit 38 is enabled.

Meanwhile the signal from the gate 43 has supplied a reset impulse to the counter 37 which then starts to count, from the preset content of the memory 22, 23 or 24, when this arrives.

As in the embodiment of FIG. 1, the content of the memory 22, 23 or 24, at the address determined by the signal at the input N is altered, and hence the corresponding output voltage increases, and continues to increase until the key is released.

By pressing the keys 3, 5 or 7 the same operation is produced, but without energisation of the U/D input of the counter which thus counts down from the number preset by the content of the associated RAM at the selected address, whereby to reduce the controlled parameter.

The counters 16, 17, 18 of FIG. 1, and the counter 37 of FIG. 2 are all identical with each other and are of the six bit output type. Likewise the memories 22, 23 and 24 and the converters 25, 26, 27 are also of the six bit type. Moreover the above mentioned counters are so constructed and arranged that counting ceases as soon as a maximum value of 63 or a minimum value of 0 is reached.

From the above description the advantages of the device of the present invention will be clearly appreciated. By operation of this circuit it is possible to associated, with every transmitter station which can be received by a receiver, the selected best setting of the receiver controls, so that it is not necessary to readjust the controls upon each change of station in order to obtain optimum reception. Moreover it is very simple, if necessary, to alter the previous adjustments for any given station should reception conditions change, and the new values will automatically be memorised and used each time the receiver is tuned to that station unless and until the adjusted values are again changed.

Naturally, in order to retain the information when the receiver is switched off the memories 22, 23, 24 have to be of the non-volatile type, or else of the low consumption type (MOS) in order thay they may be supplied by a separate voltage source, such as a dry cell, when the main voltage source is disconnected.

Many variations are possible without nevertheless going beyond the scope of the present invention. For example, the control board need not be directly connected to the rest of the circuit as shown in the above examples, but may be connected by a remote control system, for example using infra red rays; moreover the circuit may be modified so that the counters are caused to move gradually at each pressure from a control key or button so that greater precision of adjustment is obtained. Likewise, although the RAM memories 22, 23, 24 and the tuning memory 47 are shown as independent memories, they may be formed as parts of a single common memory device.

What is claimed is:

1. In a circuit device for carrying out and memorising adjustments to the tuning of a television receiver for a plurality of transmitter stations, of the type incorporating tuner memory means for memorising the value of control signals determining the tuning of the receiver, the improvement wherein:
   said tuner memory means are also operable to produce an output signal characteristic of the station to which the receiver is tuned,
   there are provided further memory means and
   there are further provided means for feeding said output signal from said tuner memory means which is characteristic of the station to which the receiver is tuned as an address signal to said further memory means,
   said further memory means storing signals determining the adjustment to at least one of the controls of said receiver other than the tuning control for every station to which the receiver can be tuned,
   means for effecting adjustment of this control of said receiver automatically in dependence on said stored signals in said further memory means when the tuning of said receiver is changed to select a different station, and
   means for selectively changing the signals stored at any one address in said further memory means whereby to change the adjustment to said one control of said television receiver in respect of any one station.

2. The circuit device of claim 1, wherein said further memory means has a plurality of sets of address locations containing information on the adjustment of a plurality of the controls of said television receiver, and there are provided means for adjusting each of these controls automatically in dependence on the value of the signals stored in the said further memory means upon each change of tuning of said receiver from one station to another.

3. The circuit device of claim 1, wherein said further memory means and said tuner memory means are formed as parts of a common memory device.

4. The circuit device of claim 1, wherein said means for adjusting the associated control of the receiver in dependence on the contents of said further memory means includes a digital-to-analogue coverter to the output of said further memory means, said digital-to-analogue converter generating a voltage signal for adjustment of said associated control of said receiver.

5. The circuit device of claim 1, wherein said further memory means comprise at least one RAM memory in non volatile NMOS technology.

6. The circuit device of claim 1, wherein said further memory means comprise at least one MOS random access memory.

7. The circuit device of claim 6, wherein said at least one RAM memory has a voltage supply from a cell battery independent from the main voltage supply to said receiver.

8. The circuit device of claim 1, wherein said means for selectively changing the signals stored at any one address in said further memory means comprise:
   processor means, and
   selector means operable to produce output signals which are fed to said processor means, the output signals from said processor means comprising digital control signals for feeding to said further memory means at an address determined at any one time by said characteristic output signal from said tuner memory means.

9. The circuit device of claim 8, wherein said further memory means comprises an individual memory device for each control of said receiver to be adjusted by said device, and there is provided a respective counter at the input of each said memory device, and a respective analogue-to-digital converter at the output of each said memory device.

10. The circuit device of claim 8, wherein said processing means comprise a single counter to the output of which are connected switching means operable to connect this output to any one of a plurality of said further memory devices in dependence on which of said buttons of said control panel are depressed.

11. The circuit device of claim 8, wherein said selector means comprise a push-button control panel having a pair of push-buttons for each said receiver control to be adjusted by said device.

12. The circuit device of claim 11, wherein said processor means comprise at least one pre-settable up-/down counter which counts up or down in dependence on which button of said panel is depressed.

13. The circuit device of claim 12, wherein the counting of said at least one counter is controlled by an oscillator circuit.

14. The circuit device of claim 12, wherein the output of said at least one counter is connected to the input of said further memory means and there are provided means for setting said further memory means into a "write" mode upon depression of one of the push buttons of the said push-button control panel.

15. The circuit device of claim 12, wherein the output of said further memory means is connected to the preset input of said at least one associated counter.